United States Patent [19]

Foulkes et al.

[11] Patent Number: 5,119,031

[45] Date of Patent: Jun. 2, 1992

[54] METHOD AND APPARATUS FOR MONITORING THE INTEGRITY OF A MULTIPLE-PLANES GROUNDING SYSTEM

[75] Inventors: Reginald M. Foulkes, Kanata; Albert S. Ashdown, Nepean, both of Canada

[73] Assignee: Northern Telecom Limited, Montreal, Canada

[21] Appl. No.: 617,333

[22] Filed: Nov. 23, 1990

[51] Int. Cl.⁵ ............................................. G01R 31/02
[52] U.S. Cl. .................................. 324/510; 324/509; 379/26
[58] Field of Search ............... 324/509, 510, 539, 541, 324/551, 530, 527, 520, 523, 627, 628; 379/26, 32, 20, 6

[56] References Cited

U.S. PATENT DOCUMENTS 4,228,475 10/1980 Sherwood ..................... 324/510 X
4,991,105 2/1991 Pimental ....................... 324/510 X Primary Examiner—Jack B. Harvey
Attorney, Agent, or Firm—F. P. Turpin

[57] ABSTRACT

A ground integrity monitor for testing for a short circuit between two equipotential ground planes having a single common connection point includes an AC generating circuit for coupling to one of the ground planes a signal having predetermined frequency and magnitude characteristics. An AC detecting circuit coupled to the other of the ground planes is adapted to detect the AC signal within a predetermined range of magnitude and frequency. Presence of the signal on the other ground plane indicates the existence of a short circuit.

9 Claims, 2 Drawing Sheets

METHOD AND APPARATUS FOR MONITORING THE INTEGRITY OF A MULTIPLE-PLANES GROUNDING SYSTEM

FIELD OF THE INVENTION

The invention relates generally to grounding systems ground integrity monitor for detecting ground faults in such systems.

BACKGROUND OF THE INVENTION

In contemporary telecommunications systems including a power supply, power converters, and electronic circuitry including logic components mounted on circuit boards housed within a frame, it is conventional to provide a grounding system that provides electrical isolation between the power supply, power converters, logic components, and the mounting frames, while ensuring that these isolated units form equipotential ground planes. A truly isolated ground system has equipotential ground planes which are completely isolated from one another except at one dedicated point. The dedicated point is typically formed of a large copper plate referred to as a central office ground (CO GRD) window. If one ground plane is connected to another except at the dedicated point, the grounding system forms a loop path through which current may flow; such a condition is referred to as a ground fault. In general, a greater amount of noise immunity is afforded in a system having ground planes which are electrically isolated from one another except at one common connection point. For example, if noise is introduced into the system's frame, electrical isolation lessens the introduction of the noise into the logic circuitry and other circuitry isolated from the frame. Systems having isolated equipotential ground planes are considered safer than systems without equipotential ground planes as there is no direct current flow between ground planes which are true equipotential planes. It is therefore desirable to have an integrity monitor that will detect the incidence of improperly interconnected ground planes in a telecommunications system.

Accordingly, it is an object of the invention to provide a reliable ground integrity monitor which will detect a ground fault resulting from improperly connected ground planes.

SUMMARY OF THE INVENTION

In accordance with the invention, there is provided a ground integrity monitor for use in a system having at least first and second ground planes connected at a single common electrical connection point, the monitor comprising an alternating current generator circuit electrically coupled to the first ground plane for coupling thereto an alternating current signal having predetermined frequency and magnitude characteristics and an alternating current signal detector circuit electrically coupled to the second ground plane for detecting an alternating current signal having a frequency corresponding to the predetermined frequency.

Also in accordance with the invention, there is provided, a method of determining the presence of a low impedance connection between first and second ground planes having a common electrical connection point. The method comprises the steps of coupling an alternating current signal having a predetermined frequency to one of the ground planes and detecting any resulting alternating current signal having the predetermined frequency on the second ground plane.

The invention thus provides the capability of determining the incidence of improperly interconnected ground planes in a telecommunications system.

BRIEF DESCRIPTION OF THE DRAWINGS

An embodiment of the invention will be described in conjunction with accompanying drawings in which.

DETAILED DESCRIPTION

Figure 1:
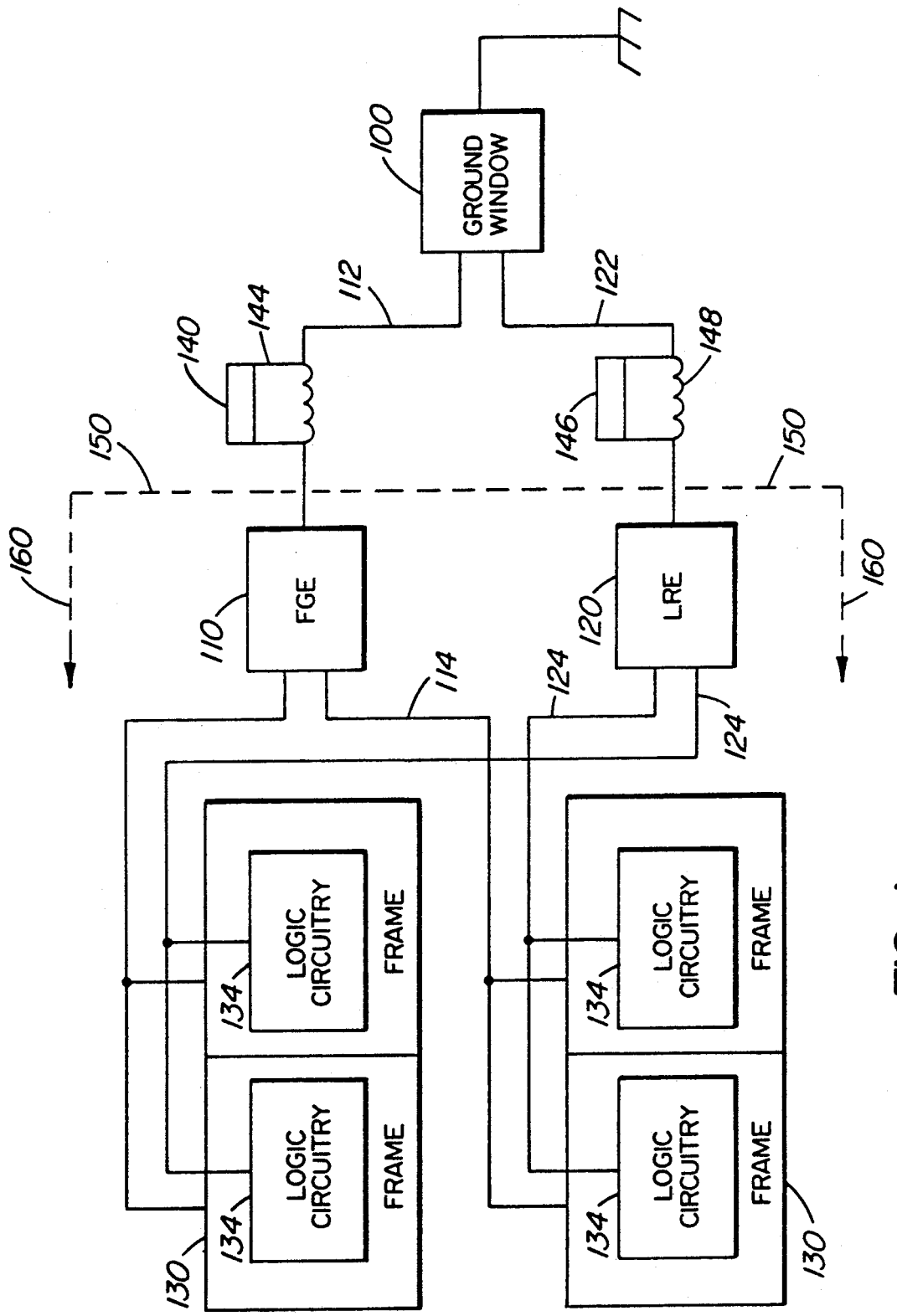
FIG. 1 is a block circuit diagram of a grounding system including an AC generator and an AC detector in accordance with the invention.

FIG. 1 shows a grounding system conventionally used in telecommunications switching systems. An equipotential grounding plane is formed by connecting two electrically isolated circuit paths together at a single common connection point. A ground window 100 formed of a large copper plate is the connection point electrically coupling the two circuit paths together. A first of the two circuit paths includes a conductive path 112 electrically coupled with both the ground window 100 and with a frame ground equalizer (FGE) 110. The first path further includes conductive paths 114 electrically coupled with the FGE 110 and with a plurality of equipment frames 130. A second of the two circuit paths includes a conductive path 122 electrically coupled to the ground window 100 and to a logic return equalizer (LRE) 120. The second path further includes conductive paths 124 electrically coupled with the LRE 120 and with a plurality of logic circuits 134, housed within, but electrically isolated from the frames 130. A signal generating circuit 140 is connected to an induction coil 144 adapted to couple a low frequency alternating current (AC) signal to the circuit path 112. A suitably tuned detector circuit 146 is connected to an induction coil 148 coupled with circuit path 122 and is adapted for detecting the presence of the low frequency AC signal thereon. The frequency of the oscillator should be outside any multiple or 216 and provides the current driver 218 and the induction coil 144 with the 9.4 Khz signal.

Figure 3:
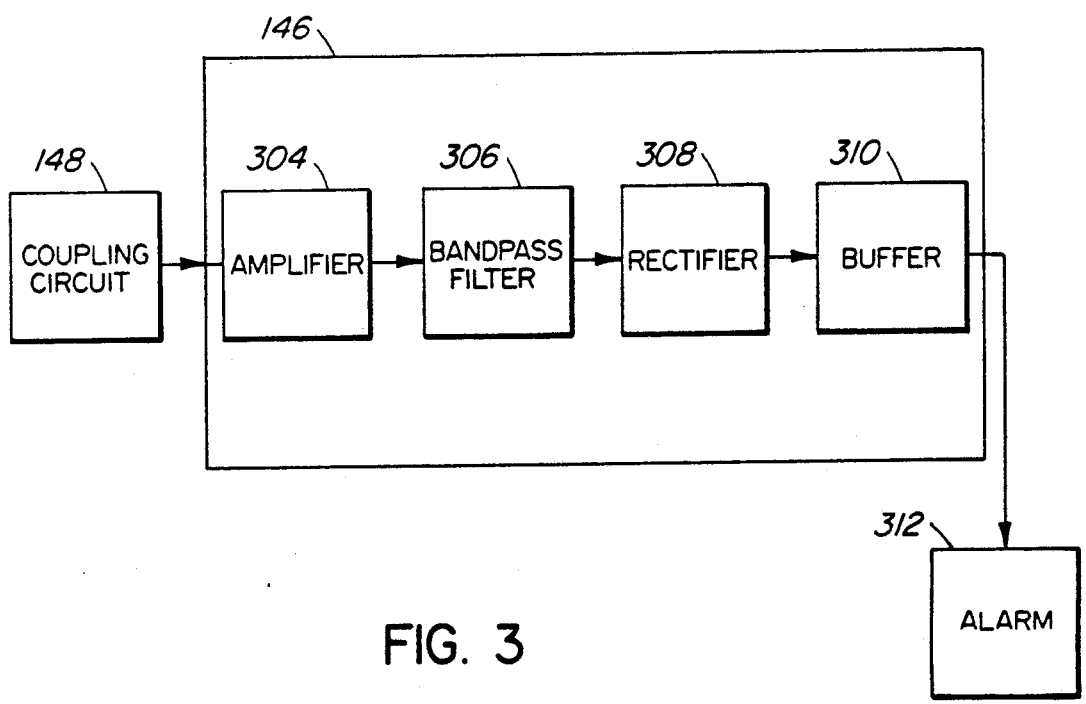
FIG. 3 is a detailed block diagram of the AC detector shown in FIG. 1.

FIG. 3 shows the detector circuit 146 connected to the detection coil 148 for inductively coupling to the logic return path 122 A single stage amplifier circuit 304 is connected to the detection coil 148 and receives the signal coupled to the detection coil 148 when a ground fault is detected. A bandpass filter 306 is responsive to an output signal generated by the amplifier circuit 304 to effectively reject all signals not centered about the frequency of 9.4 Khz. A full wave rectifier circuit 308 connected to the bandpass filter 306 receives a filtered output signal from the bandpass filter 306 and generates a direct current (DC) signal corresponding to a ground fault condition. A buffer 310 stores the rectified signal indicating a fault condition and alarm interface circuitry 312 is responsive to the buffered signal stored in buffer 310 for providing craft personnel with a visual or audible alarm.

The configuration of FIG. 1 shows the signal generating circuit 140 coupled to the frame ground path 112 and the detector circuit 146 is shown coupled to the logic ground return path 122. In practice however, the detector 146 circuit and the generator circuit 140 may be reversed, whereby the induction coil of the generator circuit 140 is coupled to the logic ground return path 122 and the induction coil 148 of the detector circuit 146 is coupled to the frame ground path 112.

The signal generating circuit 140 must provide a signal current not exceeding a predetermined safe maximum and must concurrently provide signal current which meets minimum current requirements; that is, the current driver 218 must provide the induction coil 144 with enough current to induce a sufficient current in the ground path 112 for the detection circuit 146 to detect in the event of a ground fault, while submultiple of frequencies of signals used within the telecommunications system so as not to cause interference noise. The magnitude of the signal generated by the generating circuit 140 must be sufficiently great so that the detector circuit 146 is able to detect it; however the magnitude of the current must not be so large as to be dangerous to craft personnel maintaining the system.

Any connection between the first and second paths in the direction of arrows 160 at dotted line 150 will enable an induced AC to flow within the closed circuit. Under normal operating conditions when the grounding system defined by the circuit shown in FIG. 1 is an open circuit, the detector circuit 146 will not detect a signal from the generating circuit 140. However, when a ground fault occurs, and a closed circuit is formed by an unwanted connection between the equipotential planes, the AC detector 146 will detect a signal from the generating circuit 140 and corrective action may then be taken.

When the connection between the first and second conductive paths is the result of human activity it is preferable that the detector circuit 146 not detect a fault. Thus, the detector circuit 146 should be tuned to detect ground faults within a range of zero to 400 ohms since typically the impedance of human skin is approximately 500 ohms. A short circuit for the purposes of this invention is therefore defined to be less than or equal to approximately 400 ohms.

Figure 2:
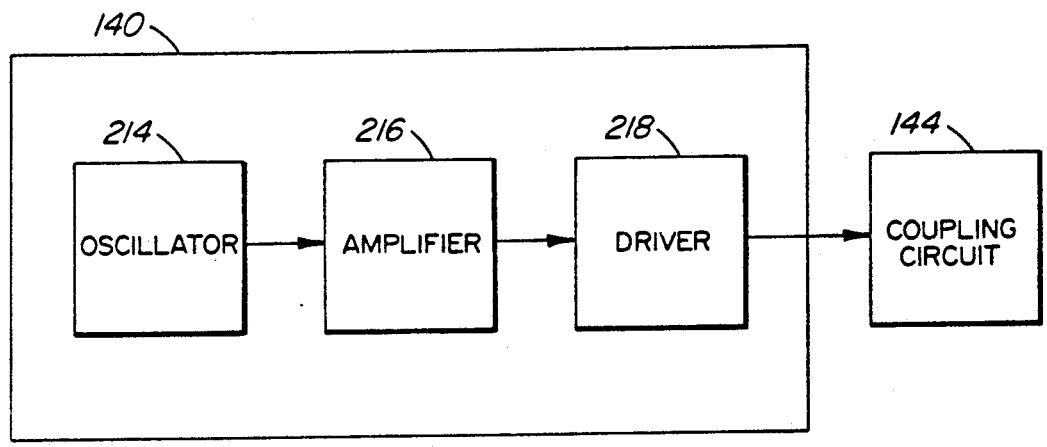
FIG. 2 is a detailed block diagram of the AC generator shown FIG. 1.

In FIG. 2, the signal generating circuit 140 is shown to include an oscillator 214, an amplifier 216, and a push-pull current driver 218 In a preferred embodiment the oscillator 214 generates an output signal having a frequency of 9.4 Khz which is received by the amplifier 216. The push-pull current driver 218 is connected to the amplifier at the same time ensuring that the amount of current induced is small enough to provide safe operation of the circuit. It has been found that satisfactory results are obtained when the induction coil 144 is provided with a 9.4 Khz signal having a maximum voltage of 15 volts and a maximum driving current of 125 mA. Using those parameters, the detector circuit 146 is capable of detecting the signal provided that the ground fault short circuit impedance is less than or equal to 400 ohms. As there may be considerable variance in cable length and type of cable used within the ground circuitry in a variety of telecommunications office configurations and installations, adjustments may have to be made for each specific configuration to obtain a desired range of detection.

Numerous other modifications, variations and adaptations may be made to the particular embodiment of the invention described above without departing from the scope of the claims.

We claim:

1. A ground integrity monitor, for use in a grounding system of a telecommunications system, the grounding system having at least first and second ground planes connected at a single common electrical point, the monitor comprising:
    (a) an alternating current generator circuit electrically coupled to the first ground plane for coupling thereto an alternating current signal having predetermined frequency and magnitude characteristics; and
    (b) an alternating current signal detector circuit electrically coupled to the second ground plane for detecting an alternating current signal having a frequency corresponding to the predetermined frequency, whereby detection of the signal indicates the existence of an undesirable connection between the ground planes at a location other than the single common electrical connection point.

2. A ground integrity monitor as defined in claim 1 wherein the alternating current generator circuit and the alternating current signal detector circuit are inductively coupled to the first and second ground planes respectively.

3. A ground integrity monitor as defined in claim 2 wherein the predetermined frequency does not correspond to any multiple or submultiple of frequencies of signals used the telecommunications system.

4. A ground integrity monitor as defined in claim 2 wherein the predetermined frequency is approximately 9.4 Khz.

5. A ground integrity monitor for use in a grounding system of a telecommunications system, the grounding system having at least first and second ground planes connected at a single common electrical connection point, the monitor comprising:
    (a) an alternating current generator circuit electrically coupled to the first ground plane for coupling thereto an alternating current signal having predetermined frequency and magnitude characteristics, the predetermined frequency not corresponding to any multiple or submultiple of frequencies of signals used within the telecommunications system; and
    (b) an alternating current signal detector circuit electrically coupled to the second ground plane for detecting an alternating current signal having a frequency corresponding to the predetermined frequency, detection of the signal indicating the existence of an undesirable connection between the ground planes and the connection having an impedance approximately 400 ohms or less.

6. A method of determining the presence of a low impedance connection between first and second ground planes having a common electrical connection point therebetween, the method comprising the steps of coupling an alternating current signal having a predetermined frequency on one of the ground planes and detecting any resulting alternating current signal having the predetermined frequency of the second ground plane, any such detection indicating the existence of an undesirable connection between the first and second ground planes.

7. In a telecommunications system, a method of determining the existence of a low impedance connection between first and second ground planes of a grounding system, the ground planes having a common electrical connection point therebetween, the method comprising the steps of coupling an alternating current signal having a predetermined frequency not corresponding to any multiple or submultiple of frequencies within the telecommunications system on one of the ground planes, and detecting any resulting alternating current signal having the predetermined frequency on the second ground plane, whereby the presence of any coupled signal on the second ground plane indicates the existence of a low impedance connection between the first and the second ground planes.

8. A method as defined in claim 7 wherein the low impedance connection has a impedance of approximately 400 ohms or less.

9. A method of ensuring that proper isolation exists between the ground planes of a grounding system comprising the steps of:
 (a) coupling an alternating current signal having a predetermined frequency not corresponding to any multiple or submultiple of frequencies within the telecommunications system on one of the ground planes; and
 (b) monitoring the other of the ground planes for the presence of an alternating current signal having the predetermined frequency, whereby such presence indicates the existence of improper isolation between the ground planes.

* * * * *